(12) United States Patent
Pueschner et al.

(10) Patent No.: US 9,384,437 B2
(45) Date of Patent: Jul. 5, 2016

(54) SMART CARD MODULE, SMART CARD BODY, SMART CARD AND SMART CARD PRODUCTION METHOD

(71) Applicant: Infineon Technologies AG, Neubiberg (DE)

(72) Inventors: Frank Pueschner, Kelheim (DE); Thomas Spoettl, Mintraching (DE); Jens Pohl, Bernhardswald (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/697,664

(22) Filed: Apr. 28, 2015

(65) Prior Publication Data

US 2015/0317553 A1 Nov. 5, 2015

(30) Foreign Application Priority Data

Apr. 30, 2014 (DE) .......................... 10 2014 106 062

(51) Int. Cl.
| | |
|---|---|
| *G06K 19/06* | (2006.01) |
| *G06K 19/077* | (2006.01) |
| *G06K 19/07* | (2006.01) |
| *H01L 25/00* | (2006.01) |
| *H01L 23/488* | (2006.01) |
| *H01L 21/48* | (2006.01) |

(52) U.S. Cl.
CPC ........ *G06K 19/07705* (2013.01); *G06K 19/077* (2013.01); *G06K 19/0716* (2013.01); *G06K 19/07754* (2013.01); *H01L 21/48* (2013.01); *H01L 23/488* (2013.01); *H01L 25/50* (2013.01); *H01L 2224/16225* (2013.01)

(58) Field of Classification Search
CPC ............ G06K 19/0716; G06K 19/077; G06K 19/07705; G06K 19/07754
USPC .................................................. 235/380, 492
See application file for complete search history.

(56) References Cited

U.S. PATENT DOCUMENTS

| | | | | |
|---|---|---|---|---|
| 4,483,067 A * | 11/1984 | Parmentier | ....... | G06K 19/07745 174/541 |
| 6,049,461 A * | 4/2000 | Haghiri-Tehrani | ............ | G06K 19/07749 235/492 |
| 6,202,932 B1 * | 3/2001 | Rapeli | .................. | G06K 7/0008 235/380 |
| 7,213,769 B2 * | 5/2007 | Knoll | ..................... | B82Y 10/00 235/451 |
| 8,025,237 B2 * | 9/2011 | Ochi | ................ | G06K 19/07732 235/492 |
| 8,724,340 B2 * | 5/2014 | Hoegerl | ........... | G06K 19/07749 361/737 |

* cited by examiner

*Primary Examiner* — Seung Lee

(57) ABSTRACT

In various embodiments, a smart card module is provided. The smart card module includes a carrier having a first main surface and a second main surface opposite the first main surface. The carrier has at least one plated-through hole. The smart card module further includes a contact array arranged above the first main surface of the carrier and having a plurality of electrical contacts. At least one electrical contact of the plurality of electrical contacts is electrically connected to the plated-through hole. The smart card module further includes a chip arranged above the second main surface. The chip is electrically coupled to at least one electrical contact of the plurality of electrical contacts by the plated-through hole. The smart card module further includes at least one optoelectronic component arranged above the second main surface and electrically conductively connected to the chip.

24 Claims, 6 Drawing Sheets

SMART CARD MODULE, SMART CARD BODY, SMART CARD AND SMART CARD PRODUCTION METHOD

CROSS-REFERENCE TO RELATED APPLICATION

This application claims priority to German Patent Application Serial No. 10 2014 106 062.8, which was filed Apr. 30, 2014, and is incorporated herein by reference in its entirety.

TECHNICAL FIELD

Various embodiments relate generally to a smart card module, a smart card body, a smart card and methods for producing them.

BACKGROUND

An integrated circuit or a chip can be arranged on or in a smart card body, which may include a plastic material, for example, such that a smart card is formed.

The smart card can be a so-called "dual interface" smart card, i.e. the smart card may include both a contact area structure for electrically connecting the smart card to a device, e.g. to a card reader, and a device for wireless communication, which uses induction for data exchange and power supply of the smart card, for example by the use of radio waves.

A smart card having an interface for wireless data transfer (also designated as wireless interface, CL interface, as an abbreviation of "contactless interface") may furthermore include a display device for displaying information (also designated as display unit), for example a display device which uses light emitting diodes (LEDs) (also designated as LED display).

The smart card having the integrated display device can be used, for example, to display passwords provided for a single use. Such one-time passwords can make security of a cashless payment by a bank card more secure.

Furthermore, one-time passwords could for example also be used in electronic identity cards (e.g. in an electronic passport or an electronic personal identity card). The one-time password can be a security feature which is used particularly in applications which require a high degree of security.

In order to enable data exchange with a smart card having a display device by a contact area structure as well (also designated as contact interface, or CB interface, as an abbreviation of "contact based interface"), the smart card should be equipped with a wireless interface, a contact interface and a display device, e.g. an LED display. For simple handling of the smart card, also designated as card for short, exposed contacts (also designated as contact array) of the contact interface and a display of the display device can be arranged on the same side of the smart card.

SUMMARY

In various embodiments, a smart card module is provided. The smart card module includes a carrier having a first main surface and a second main surface opposite the first main surface. The carrier has at least one plated-through hole. The smart card module further includes a contact array arranged above the first main surface of the carrier and having a plurality of electrical contacts. At least one electrical contact of the plurality of electrical contacts is electrically connected to the plated-through hole. The smart card module further includes a chip arranged above the second main surface. The chip is electrically coupled to at least one electrical contact of the plurality of electrical contacts by the plated-through hole. The smart card module further includes at least one optoelectronic component arranged above the second main surface and electrically conductively connected to the chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
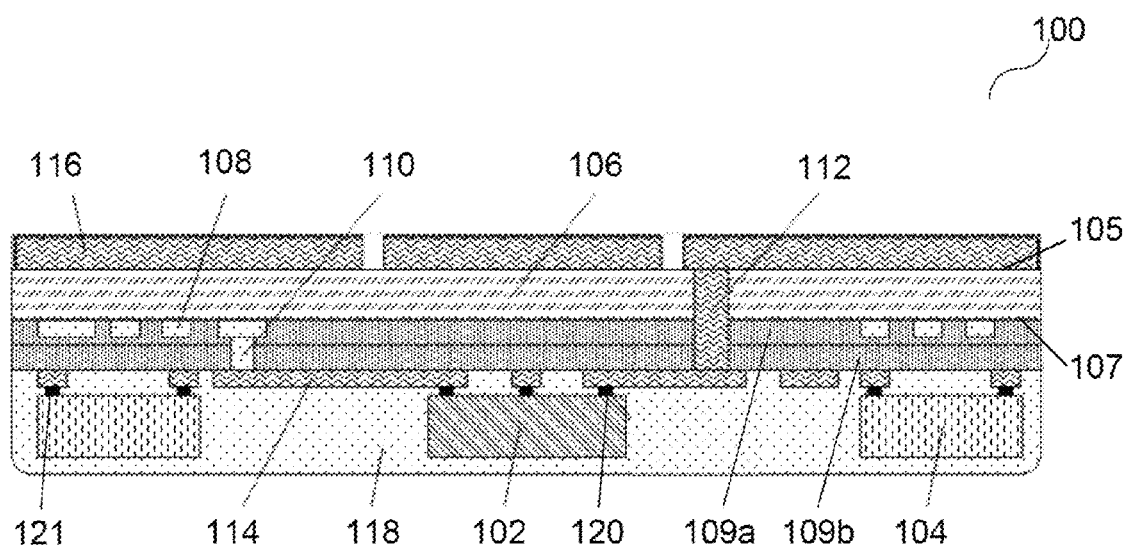
FIG. 1 shows a cross-sectional view of a smart card module in accordance with various embodiments.

The following detailed description refers to the accompanying drawings that show, by way of illustration, specific details and embodiments in which the invention may be practiced.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the context of this description, the terms "connected" and "coupled" are used to describe both a direct and an indirect connection and a direct or indirect coupling. In the figures, identical or similar elements are provided with identical reference signs, insofar as this is expedient.

An optoelectronic component can be an electromagnetic radiation emitting component or an electromagnetic radiation absorbing component. An electromagnetic radiation emitting component can be for example a light emitting diode (LED). An electromagnetic radiation absorbing component can be for example a photoreceiver.

In various embodiments, the term "transparent" or "transparent layer" can be understood to mean that a layer is transmissive to electromagnetic radiation, for example to electromagnetic radiation in the ultraviolet (UV, from approximately 50 nm to approximately 380 nm), visual (from approximately 380 nm to approximately 780 nm) and/or infrared (IR, from approximately 780 nm to approximately 1 mm) wavelength range, or at least in a subrange of the visual wavelength range, wherein light coupled into a structure (for example a layer) is also coupled out from the structure (for example layer) substantially without scattering or light conversion.

Hereinafter, the term "light" is also used for electromagnetic radiation in the UV, visual and/or IR wavelength range. Unless described otherwise, the electromagnetic radiation is thus not intended to be restricted to a subrange of the range from approximately 50 nm to approximately 1 mm, for example not to the visual wavelength range.

FIG. 1 illustrates a cross-sectional view of a smart card module 100 in accordance with various embodiments.

In various embodiments, the smart card module 100 may include a carrier 106 having a first main surface 105 and a second main surface 107 opposite the first main surface, and a chip 102. The smart card module 100 may furthermore include further structures which are used together with the chip 102, for example contact, protective or supporting structures, etc.

In various embodiments, the carrier 106 may include or essentially consist of a dielectric material, for example a plastic material, for example a polymer.

In various embodiments, the chip 102 may include a silicon main layer, e.g. a silicon substrate or a silicon wafer. The silicon main layer of the chip 102 can have a thickness in a range of approximately 10 μm to approximately 200 μm, for example of approximately 30 μm to approximately 80 μm, for example in the range of approximately 50 μm, for example a thickness of less than or equal to 50 μm, e.g. 48 μm.

The chip 102 be arranged above the second main surface 107 of the carrier 106.

Furthermore, the chip 102 may include at least one metallization layer.

The chip 102 may include at least one chip contact 120.

In various embodiments, the chip 102 may include at least one integrated circuit, an electronic circuit, a memory chip or an RFID chip (a chip for identification by electromagnetic waves, an abbreviation of the corresponding term "radio frequency identification") or any other type of chip.

In various embodiments, the smart card module 100 may include a contact array 116 having a plurality of electrical contacts 116. The plurality of electrical contacts 116 can be arranged in the form of rows and columns, for example as two rows with respectively two columns, as three rows with respectively two columns, etc. The contacts 116 can be arranged for example in accordance with the ISO 7816 standard.

The contacts 116 may include or substantially consist of a conductive material, e.g. a metal, a metal alloy, a metallic material, or a metallic compound. The contacts may include for example at least one metal from Cu, Al, Au, Ag, Pt, Ti, Ni, Sn, Zn, Pb, or any nonmetallic, electrically conductive material, e.g. graphite.

The contacts 116 may have lateral dimensions in a range of approximately 100 μm to approximately 15 mm, e.g. of approximately 500 μm to approximately 5 mm, e.g. approximately 2.5 mm.

The contacts 116 can be electrically connected to the chip 102 by one or a plurality of the at least one chip contact 122.

Furthermore, the contacts 116 can be arranged above the first main surface 105 of the chip module 100. The contact array 116 i.e. the contacts 116 can be exposed. To put it another way, the contacts 116 can be arranged above the first main surface 105 such that they are accessible from an outer side of the chip module 100.

In various embodiments, the carrier 106 can have at least one plated-through hole 112, also designated as via 112. The plated-through hole 112 may include or essentially consist of an electrically conductive material.

The chip 102 can be electrically conductively connected to at least one of the contacts 116 by the at least one plated-through hole 112. The chip 102 can be electrically conductively connected to the at least one contact 116 for example by the electrical chip contact 120 and by the plated-through hole 112. To put it another way, the chip 102 can be electrically conductively connected to the contact array 116 for the purpose of providing a functionality of contact based communication of the smart card module. Although only one plated-through hole 112 is illustrated in FIG. 1, the carrier 106 can have as many plated-through holes 112 as necessary in order to electrically conductively connect the chip 102 as intended to the contacts 116 the contact array 116.

In various embodiments, the smart card module 100 may include a metallization layer 114 for example a structured metallization layer 114. The metallization layer 114 can be arranged above the second main surface 107 of the carrier 106. The chip 102 can be electrically conductively connected, for example soldered, to the metallization layer 114 for example by one or a plurality of the at least one chip contact 122.

In various embodiments, the smart card module 100 may include an antenna 108 (also designated as first antenna 108) and a dielectric layer 109a arranged between the antenna 108 and the metallization layer 114. The antenna 108 can be arranged above the second main surface 107 of the carrier 106. By way of example, the antenna 108 can be arranged on the second main surface 107 of the carrier 106, or the antenna 108 can be substantially completely embedded into the dielectric layer 109a, which can be arranged above the second main surface 107 of the carrier 106. The antenna 108 can be arranged in a plane running substantially parallel to the second main surface 107. The plane in which the antenna 108 can run can be arranged between the second main surface 107 and the metallization plane 114.

The antenna 108 may include an electrically conductive material, for example a metal, for example aluminum.

The antenna 108 can be formed by forming a metal layer on or above the carrier 106 and etching the metal layer.

In various embodiments, the dielectric layer 109a and, if appropriate, the dielectric layer 109b may include a dielectric, for example a polymer, for example silicone, polyethylene terephthalate (PET), polyvinyl chloride (PVC), or polycarbonate (PCB).

The dielectric layer 109a may include an adhesion medium, for example an adhesive, for example silicone. The antenna 108 may be formed for example on the dielectric layer 109a and be fitted on the carrier 106 by the adhesion medium 109a.

In various embodiments, the antenna 108 may include or essentially consist of an individual conductive line. The antenna 108 may be arranged in the plane such that it is formed around a region, for example around a rectangular or square region. In various embodiments, the antenna 108, as is illustrated in FIG. 1, can be formed in a plurality of lines, for example two or three thereof, around the rectangular or square region.

In various embodiments, the dielectric layer 109a and/or the dielectric layer 109b can have at least one plated-through hole 110. The plated-through hole 110 may include or essentially consist of an electrically conductive material.

The chip 102 can be electrically conductively connected to the antenna 108 by the at least one plated-through hole 110. The chip 102 can be electrically conductively connected to the antenna 108 for example by one of the electrical chip contacts 120 and by the plated-through hole 110. To put it another way, the chip 102 can be electrically conductively connected to the antenna 108 in order to provide a functionality of wireless communication of the smart card module in association with a smart card body, in which a booster antenna can be arranged and to which the antenna 108 can be inductively coupled (not illustrated in FIG. 1, but see e.g. FIG. 2). Although only one plated-through hole 110 is illustrated in FIG. 1, the dielectric layer(s) 109a, 109b can have as many plated-through holes 110 as necessary in order to electrically conductively and functionally connect the chip 102 to the antenna 108.

In various embodiments, the smart card module 100 may include at least one optoelectronic component 104. The at least one optoelectronic component 104 can be arranged above the second main surface 107.

The at least one optoelectronic component 104 may include at least one component contact 121.

The chip 102 may be electrically conductively connected to the optoelectronic component 104 by the at least one component contact 121. By way of example, the chip 102 may be electrically conductively connected to the optoelectronic component 104 by the at least one chip contact 120, by the metallization layer 114 and by the at least one component contact 121.

In various embodiments, the smart card module 100 may be formed such that the antenna 108 and the metallization layer 114 are not arranged in or formed from separate layers, but rather are formed from a common metallization layer (not illustrated). This is possible, for example, if an area required by the chip 102, the at least one optoelectronic component 104 and the assigned metallization for the electrically conductive contacting of the chip 102 and of the optoelectronic component 104 is small enough to be arranged in the region around which the antenna 108 is arranged. An electrically conductive coupling of an end of the antenna 108 that is arranged in a manner remote from the chip 102 can be effected for example by a contact, which can be arranged above the first main surface 105 in a plane of the contact array 116, for example by the contact and a plurality of plated-through holes 112.

In various embodiments, the at least one optoelectronic component 104 may be arranged above the second main surface 107 such that an active area of the optoelectronic component 104, i.e. an area of the optoelectronic component 104 which is designed to emit or, for example by a detector layer, to absorb electromagnetic radiation, faces away from the second main surface 107.

In various embodiments, the at least one optoelectronic component 104 can be designed to emit electromagnetic radiation. By way of example, the optoelectronic component 104 can be or include an inorganic or an organic light emitting diode.

In various embodiments, the at least one optoelectronic component 104 may be designed to absorb electromagnetic radiation and to provide a signal assigned to the absorbed radiation. By way of example, the optoelectronic component 104 may be a photoreceiver (also designated as photodetector), for example a photodiode, a photoresistor or a solar cell.

The smart card module 100 may include a plurality of optoelectronic components 104. The optoelectronic components 104 may be arranged in a predetermined arrangement, for example above the second main surface 107. In the case of the emitting optoelectronic component 104, the smart card module can be designed to display predetermined symbols, for example numerals, by targeted driving of individual or all optoelectronic components 104 of the plurality of optoelectronic components 104. This can be used, for example, to display a numeral, combination of numerals or sequence of numerals provided, for example generated, by the chip 102, for example for a security application.

The plurality of optoelectronic components 104 can emit light of different wavelengths; by way of example, at least one optoelectronic component 104 of the plurality of optoelectronic components 104 can be designed to emit green light, and at least one other optoelectronic component 104 of the plurality of optoelectronic components 104 can be designed to emit red light. This may make it possible to symbolically display a state provided by the chip 102, for example green light provided by the green-emitting optoelectronic component 104 for a fault-free state and red light provided by the red-emitting optoelectronic component 104 for a presence of a fault. Any other combination of colors, single- or multicolored images or symbols, letters or the like would likewise be possible.

In various embodiments, the wavelength of the radiation emitted by the optoelectronic component 104 can lie outside the visual spectral range, for example in the UV or infrared range. In that case, the display can be provided for a suitable detector; the representable symbols can correspond to the symbols represented in association with those in the visual spectral range, etc.

In various embodiments, the emission of the at least one optoelectronic component 104 may be static for a display duration of a display. To put it another way, the chip 102 can drive the at least one optoelectronic component 104 such that it emits electromagnetic radiation and, after the predetermined display duration has been attained, can end driving of the optoelectronic component 104 or drive the optoelectronic component 104 such that it ends the emission of the electromagnetic radiation.

In various embodiments, the emission of the at least one optoelectronic component 104 can be dynamic for a display duration of a display. To put it another way, the chip 102 can drive the at least one optoelectronic component 104 such that it emits electromagnetic radiation in a temporally variable manner during the display duration, for example in a flashing manner, or—in the case of the plurality of optoelectronic components 104—in such a way that a temporal succession of symbols is displayed, for example a succession of numerals.

At the end of the display duration, the chip 102 can end driving of the optoelectronic component 104 or drive the optoelectronic component 104 such that it ends the emission of the electromagnetic radiation. Furthermore, the dynamic display can undergo transition to the static display, and vice versa.

In various embodiments, a plurality of the optoelectronic components 104 which can be designed to absorb electromagnetic radiation and to provide a signal assigned to the absorbed radiation, hereinafter designated as photoreceivers, can be arranged in a predetermined arrangement. This can make it possible, by the photoreceiver arrangement, to detect structured electromagnetic radiation impinging thereon. The electromagnetic radiation can be structured for example in an area in which the photoreceivers are arranged, for example structured to form symbols by illuminated (also designated as bright) and non-illuminated (also designated as dark) regions, or by regions which are irradiated with electromagnetic radiation of different wavelengths. By way of example, detection of letters, numerals or images imaged onto the photoreceiver arrangement can be made possible.

The at least one photoreceiver 104 can be designed to detect a temporal dynamic range of the electromagnetic radiation absorbed by said at least one photoreceiver and to provide an assigned signal. By way of example, the photoreceiver 104 can be designed to provide, during a detection duration with presence of an incidence state in which electromagnetic radiation is incident on the photoreceiver 104, a different signal, e.g. for the chip 102, than with the presence of a non-incidence state in which no or substantially no electromagnetic radiation is incident on the photoreceiver. The photoreceiver 104 can be designed such that it detects an intensity of the absorbed radiation and provides an assigned signal, e.g. for the chip 102.

Furthermore, the at least one photoreceiver 104 can be designed to detect electromagnetic radiation of different wavelengths and to provide an assigned signal. The assigned signal can be designed for example such that the electromagnetic radiation of the different wavelengths, for example for a predetermined number of wavelength ranges, is differentiated. The assigned signal can for example also be designed such that the electromagnetic radiation of the different wavelengths is detected jointly, such that a signal is provided only for a common wavelength range.

The at least one photoreceiver 104 can be designed to detect electromagnetic radiation of only one wavelength or in only one wavelength range (for example only red light, only green light or only UV radiation) and to provide an assigned signal. If a plurality of the photoreceivers 104 are present, the photoreceivers can be designed to detect electromagnetic radiation in the same wavelength range, or they can be designed to the effect that they at least partly detect electromagnetic radiation of different wavelengths. By way of example, one or a plurality of the photoreceivers 104 can be designed to detect green light, and one or a plurality of the photoreceivers 104 can be designed to detect red light.

In various embodiments, the plurality of optoelectronic components 104 may include at least one emitting optoelectronic component 104 and at least one photoreceiver 104. To put it another way, the smart card module 100 can be designed both for emitting and for absorbing electromagnetic radiation.

In various embodiments, the smart card module 100 may include an encapsulation 118. The encapsulation 118 can be arranged above the second main surface 107. The encapsulation 118 can be arranged such that it encapsulates the chip 102 and/or the at least one optoelectronic component 104 and/or the metallization layer 114. To put it another way, the encapsulation layer 118 can be arranged such that it substantially completely envelops parts and/or areas of the chip 102 and/or of the at least one optoelectronic component 104 and/or of the metallization layer 114 which are exposed prior to encapsulation. The encapsulation layer 118 can protect the chip 102 and/or the optoelectronic component 104 and/or the metallization layer 114 and/or the electrically conductive connections between the chip 102 and the metallization layer and between the chip 102 and the antenna 108, for example against mechanical actions, against air humidity, etc.

The encapsulation layer 118 may include a polymer, for example a transparent polymer, for example silicone. The encapsulation layer 118 can be transmissive or substantially transmissive to electromagnetic radiation of the wavelength(s) which the optoelectronic component 104 emits or absorbs.

The encapsulation layer 118 can be applied above the second main surface 107 by potting and curing.

In various embodiments, the encapsulation layer 118 may include a plurality of individual partial layers. By way of example, a first partial layer of the encapsulation layer 118 can be applied directly on the second main surface 107 and extend in a direction away from the second main surface 107 to an extent such that the active area of the optoelectronic component 104 still remains free of the first partial layer. A second partial layer of the encapsulation layer 118 can be applied indirectly above the second main surface 107, for example on or above the first partial layer. The second partial layer can extend in a direction away from the second main surface 107 to an extent such that the active area of the optoelectronic component 104 is covered by the second partial layer. In this example, a transparent material need be used only for the second partial layer. A material for the first partial layer can be chosen on the basis of other parameters, for example thermal conductivity, adhesion capability, stability/ elasticity, costs, etc.

Figure 2A:
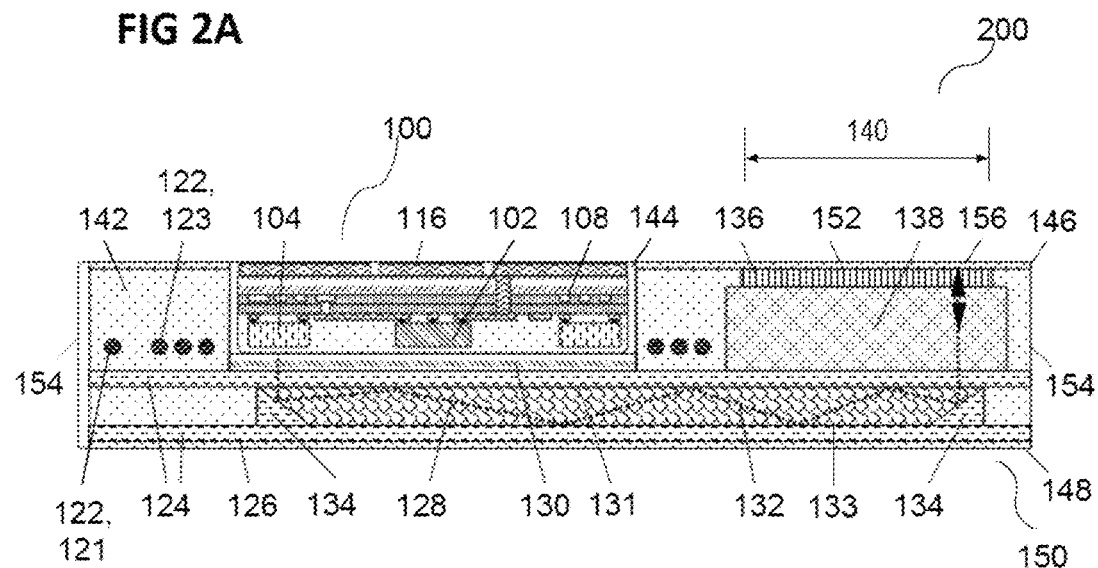
FIGS. 2A and 2B show cross-sectional views of smart cards in accordance with various embodiments.
Figure 2B:
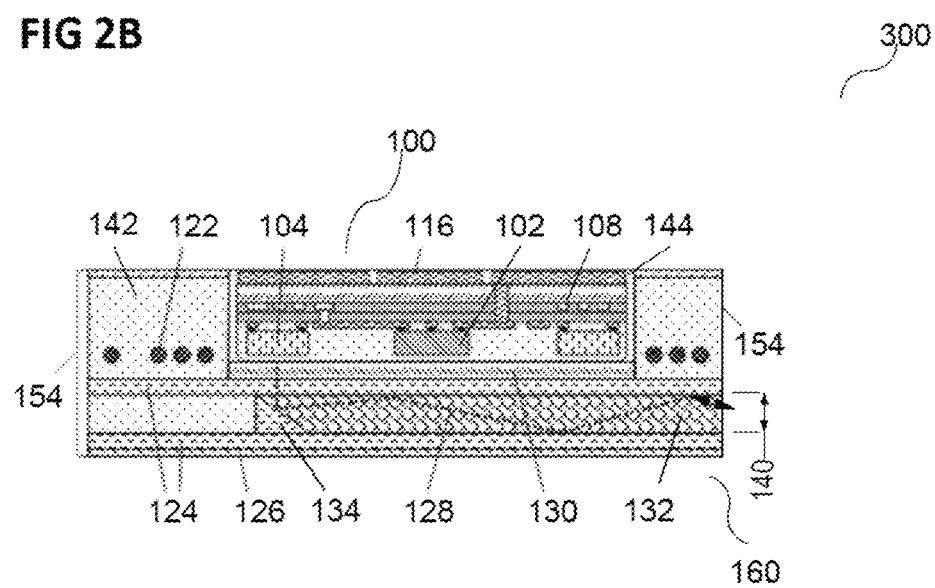

FIG. 2A and FIG. 2B show cross-sectional views of smart cards 200, 300 in accordance with various embodiments.

In various embodiments, the smart cards 200, 300 illustrated in FIG. 2A and FIG. 2B may include a smart card body 150 and 160, respectively, in each case having a first card side 146, a second card side 148 opposite the first card side 146, and four side surfaces 154 connecting the two card sides 146, 148, and a smart card module 100. The smart card body 150, 160 may furthermore include a smart card module receptacle opening 144. The smart card module 100 can be arranged in the smart card module receptacle opening 144. The smart card module 100 can be arranged in the smart card module receptacle opening 144 for example by an adhesion medium 130, for example by a transparent adhesion medium 130, for example a transparent adhesive 130, e.g. a transparent hot melt adhesive 130.

In various embodiments, the smart card module 100 can correspond to the smart card module 100 illustrated in FIG. 1.

In various embodiments, the smart card body 150, 160 may include a first polymer layer 142. The first polymer layer 142 may include or essentially consist of a polymer, for example a thermoplastic. The polymer can be for example at least one from a group of PCB, PET and PVC. The first polymer layer 142 may include a single layer. The first polymer layer 142 may include a layer stack composed of two or more layers.

In various embodiments, the first polymer layer 142 can have an opening 144. The opening 144 can be formed in the first polymer layer 142 such that a smart card module, for example the smart card module 100 which was described in association with FIG. 1, can be arranged therein.

In various embodiments, the smart card body 150, 160 may include a booster antenna 122. The booster antenna 122 can be designed such that it can receive and transmit electromagnetic signals for wireless communication with an external device, for example by inductive coupling. Moreover, the booster antenna 122 can be designed such that it can communicate with the antenna 108 wirelessly, for example by inductive coupling.

In various embodiments, the booster antenna 122 can be arranged in, on or above the first polymer layer 142.

The booster antenna 122 can be arranged in a plane running substantially parallel to the first card side 146 and/or to the second card side 148.

The booster antenna 122 may include an electrically conductive material, for example a metal, for example aluminum.

The booster antenna 122 can be formed by forming a metal layer on or above the first polymer layer 142 and etching the metal layer, or it can be printed onto the first polymer layer 142, for example.

In various embodiments, the booster antenna 122 can be formed on or above a layer of the layer stack which is part of the first polymer layer 142, and the layers of the layer stack, after the antenna 122 has been formed, can be stacked and/or connected to one another such that the antenna 122 is situated in an interior of the layer stack, i.e. in an interior of the first polymer layer 142.

The booster antenna 122 can be arranged at least partly (identified by 122, 121) in edge regions of the smart card body 150, 160, that is to say near the side surfaces 154 of the smart card body 150, 160. The booster antenna 122 can be formed at least partly (identified by 122, 123) near the smart card module 100. The booster antenna 122 can thus form a first inductive coupling region for inductive coupling to the antenna 108.

In various embodiments, the smart card body 150, 160 may include a light guiding structure 132. The light guiding structure 132 can be configured such that it can guide electromagnetic radiation or light in its interior.

The light guiding structure 132 can be configured as a layer. The light guiding structure 132 can have a first main side 131 facing the first card side 146 and a second main side 133 opposite the first main side, and also side surfaces connecting the first main side 131 and the second main side 133 to one another substantially parallel to a (main) light guiding direction, and end surfaces connecting the first main side 131 and the second main side 133 to one another substantially perpendicularly to a (main) light guiding direction. The light guiding structure 132 can be arranged in the smart card body 150, 160 such that the first main side 131 and/or the second main side 133 extend(s) substantially parallel to the first card side 146 and/or to the second card side 148. The light guiding structure 132 can form for example a substantially complete layer of the smart card body 150, 160. In various embodiments, the light guiding structure 132 can form a part of a layer of the smart card body 150, 160. In various embodiments, light guiding in the light guiding structure 132 can be effected substantially laterally, i.e. substantially parallel to the first main side 131 and/or to the second main side 133. In various embodiments, light guiding in the light guiding structure 132 can be effected substantially perpendicularly to the first main side 131 and/or to the second main side 133.

In various embodiments, a material of the light guiding structure 132 may include or essentially consist of a polymer, for example a transparent polymer, for example a thermoplastic, for example PCB, for example PCB of optical quality. The light guiding structure 132 may include a diffuser film, for example.

The light guiding structure 132 can have a length in a range of approximately 5 mm to approximately 86 mm, for example of approximately 10 mm to approximately 50 mm, in a direction in which the electromagnetic radiation is substantially guided. The light guiding structure 132 can have a width in a range of approximately 5 mm to approximately 86 mm, for example of approximately 10 mm to approximately 50 mm, in a lateral direction perpendicular to the length direction. In various embodiments, a maximum length and a maximum width of the light guiding structure 132 can correspond to a length and a width of the smart card body 150, 160. To put it another way, a layer of the smart card body 150, 160 can be formed by or essentially consist of the light guiding structure 132. In various embodiments, the length and/or the width of the light guiding structure 132 can be less than the length and/or the width of the smart card body 150, 160. To put it another way, only a part of a layer of the smart card body 150, 160 can be formed by or essentially consist of the light guiding structure 132.

The light guiding structure 132 can have a thickness in a range of approximately 0.1 mm to approximately 0.76 mm, for example of approximately 0.2 to approximately 0.6 mm.

In various embodiments, the light guiding structure 132 may include a plurality of coupling regions 240, 244 (see e.g. FIG. 3A and FIG. 3B) for optical coupling. To put it another way, the coupling regions 240, 244 can be part of the light guiding structure 132. The coupling regions 240, 244 can be configured such that electromagnetic radiation, for example electromagnetic radiation in the visual, UV and/or infrared wavelength range, can be coupled into the light guiding structure 132 through them or/and can be coupled out of the light guiding structure 132 through them.

At least one coupling region 240 from the plurality of coupling regions 240, 244, also designated as second coupling region 240, can be optically coupled to the at least one optoelectronic component 104 and can be physically and optically nearer the optoelectronic component 104 than the other coupling region 244 from the plurality of coupling regions 240, 244. The second coupling region 240 can be optically coupled to the optoelectronic component 104 for example directly, e.g. by physical contact. In various embodiments, the second coupling region 240 can be optically coupled to the optoelectronic component 104 indirectly, for example by a layer 124, for example a transparent layer 124, e.g. by a transparent adhesive 124.

At least one coupling region 244 from the plurality of coupling regions 240, 244, also designated as first coupling region 244, can be optically coupled to an optical region 140 for emitting or absorbing the electromagnetic radiation and can be physically and optically nearer the optical region 140 than the other coupling region 240 from the plurality of coupling regions 240, 244. By way of example, the first coupling region 244 can be optically coupled to the optical region 140 directly, e.g. by physical contact. In various embodiments, the first coupling region 244 can be optically coupled to the optical region 140 indirectly, for example by a transparent mediator structure 138. The transparent mediator structure 138 can be regarded as a second light guiding structure, which transmits the light without reflecting it.

Consequently, the at least one optoelectronic component 104, the second coupling region 240, the light guiding structure 132, the first coupling region 244 and the optical region 140 can be optically coupled. To put it another way, in each case at least one first coupling region 244 and at least one second coupling region can be optically coupled, for example optically connected, to one another by the light guiding structure 132. Here in each case one coupling region from the first coupling region 244 and the second coupling region 240 can be used for coupling in the light, and the other coupling region from the first coupling region 244 and the second coupling region 240 can be used for coupling out the light. Which of the coupling regions is designated as first or second coupling region 244 or 240, respectively, can result from whether the coupling region spatially and/or relative to a path taken by the light through the coupled optical elements of the chip body 150, 160 lies nearer the optical region 140 (the latter is designated as the first coupling region 244) or nearer the optoelectronic component 104 (the latter is designated as the second coupling region 240).

In various embodiments, the light guiding structure 132 can guide the light by allowing the light to be transmitted, substantially without deflecting it. In various embodiments, the light guiding structure 132 can guide the light by deflecting, e.g. reflecting, the light within the light guiding structure.

By way of example, the light guiding structure 132 can be configured such that light coupled, e.g. radiated, into its interior is deflected toward an interior of the light guiding structure 132 at least at partial regions of the main sides 131, 133 of the light guiding structure 132.

The deflection of the light at the main sides 131, 133 of the light guiding structure 132 can be effected for example by reflection, for example if the light guiding structure 132 is provided with a reflective layer, for example with a metal layer, e.g. a layer which includes at least one of aluminum, silver or gold or essentially consist s thereof. The metal layer can be applied by vapor deposition or sputtering, for example. The metal layer can have a thickness in a range of approximately 1 nm to approximately 20 nm, for example of approximately 2 nm to approximately 10 nm. The metal layer can be configured such that no metal layer is present in the coupling regions 240. It is possible for the metal layer not to be formed in the coupling regions 240 of the light guiding structure 132, or in the coupling regions 240, after the metal layer has been formed, the metal layer can be removed again, for example by a laser. If the guiding of the light in the light guiding structure 132 is obtained by the metal coating, i.e. by reflection, the layer 124 arranged between the first main side of the light guiding structure and the smart card module receptacle region 144 can be transparent at least in regions through which light is radiated, for example before coupling into the light guiding structure 132 and/or after coupling out of the light guiding structure. The layer 124, by contrast, arranged between the second main side of the light guiding structure 132 and the second card side 148 then need not be transparent.

Figure 3A:
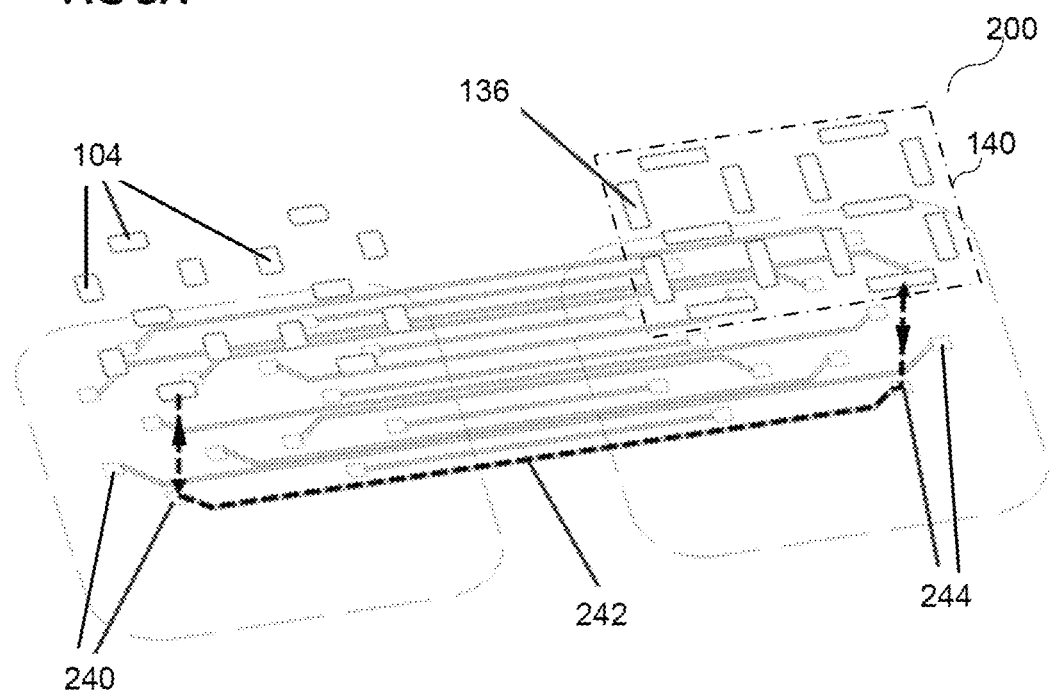
FIGS. 3A and 3B show perspective views of individual structures of smart cards in accordance with various embodiments.
Figure 3B:
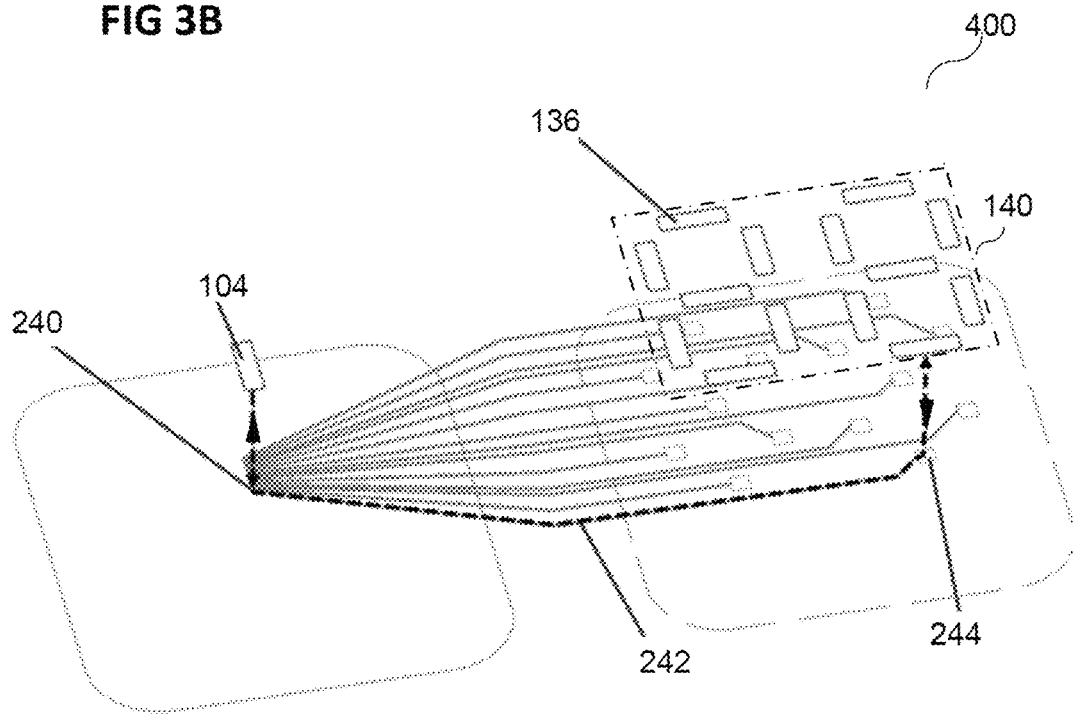
Figure 4:
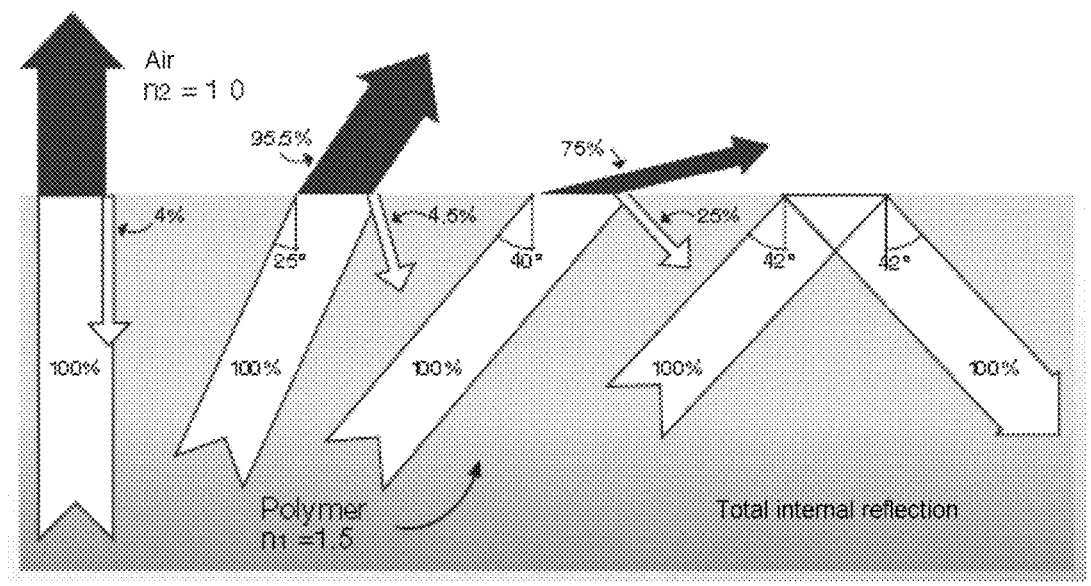
FIG. 4 shows a schematic illustration of a total internal reflection.

The deflection of the light at the main sides 131, 133 of the light guiding structure 132 can be effected by total internal reflection, for example if the material of the light guiding structure 132 has a higher refractive index than a material of the layers which are in physical contact with the first and second main sides of the light guiding structure 132, for example the layers 124. The layers 124 can be transparent layers 124. To put it another way, the materials of the light guiding structure 132 and of the transparent layers 124 can be chosen such that the refractive index n1 of the light guiding structure 132 is higher than the refractive index n2 of the transparent layers 124. By way of example, the refractive index n1 of the light guiding structure 132 can be a multiple of the refractive index n2 of the transparent layers 124, that is to say that the following can hold true: n1=a·n2. The factor a can be for example in a range of approximately 1.05 to 2, for example in a range of 1.1 to 1.5. FIG. 4 illustrates the principle of total internal reflection (see description in respect thereof). A construction and a structuring of the light guiding structure 132 are described in association with FIG. 3A and FIG. 3B.

In various embodiments, the smart card body 150, 160 can have at least one deflection geometry 134. The at least one deflection geometry 134 can be configured such that it deflects light coupled, e.g. radiated, into the light guiding structure 132. This is illustrated in each case for a light beam 128 in FIG. 2A and in FIG. 2B. The deflection of the coupled-in light by the deflection geometry can be effected for example before the light is guided by the light guiding structure 132, in order to deflect the light in a direction which enables the guiding (e.g. by total internal reflection within the light guiding structure 132) by the light guiding structure 132, or after the light has been guided by the light guiding structure 132, in order to enable the light to be coupled out of the light guiding structure 132, e.g. in the direction toward the optical region 140 or in the direction toward the photoreceiver 104.

The optoelectronic component 104 can be arranged for example in the smart card module 100 such that light is emitted or detected through a side surface of the smart card module 100 and through a lateral wall of the opening 144. The light guiding structure 132 can be arranged, for example in the first polymer layer 142, such that it takes up light into its end side, for example light which is emitted by the optoelectronic component 104 in the direction toward the side surface of the smart card module 100 and toward the lateral wall of the opening 144. Such an arrangement of the light guiding structure 132, of the optoelectronic component 104 and of the opening 144 can also be used to the effect that the light guiding structure 132 emits light from one of its end sides in the direction toward the lateral wall of the opening 144 and the side surface of the smart card module 100, such that the optoelectronic component 104 can detect the light emitted from the end side of the light guiding structure 132.

At least one deflection geometry 134 can be arranged at an end of the light guiding structure 132 which is near the optical region 140. The deflection geometry 134 can be configured such that it deflects the light guided by total internal reflection in the light guiding structure 132 substantially parallel to the first 146 and/or the second card side 148 in a different direction, for example in a direction different by approximately 90 degrees, for example to the first card side 146, on which the contact array 116 can also be arranged. In this regard, by a deflection geometry 134 at only one end of the light guiding structure 132 (the end which is near the optical region 140), the light guiding structure 132 can be designed, by the optical region 140 also arranged on the first card side 146, to provide a display on the same card side 148 as the contact array 116. Mutatis mutandis, this example can also hold true for the case where the light is coupled, e.g. radiated, into the light guiding structure 132 through the optical region 140, is deflected at the deflection geometry 134, is passed on through the lateral wall of the opening 144 and the side surface of the smart card module 100 toward the optoelectronic component 104 and is detected by the optoelectronic component 104.

In various embodiments, as is illustrated in FIG. 2B, by a deflection geometry 134 at only one end of the light guiding structure 132 (the end which is near the optoelectronic component 104), for example at one end surface of the light guiding structure 132, the light guiding structure 132 can be designed, by the optical region 140 arranged at one of the side surfaces 154 of the card body 150, to provide a display. For this purpose, the light can be emitted by the optoelectronic component 104 in the direction toward a base surface of the opening 144, can enter the light guiding structure 132 through the first main side 131, and at the deflection geometry 134, which can be provided in a reflective fashion, e.g. at an angle of approximately 45 degrees with respect to the light beam, can be deflected (for example such that an angle of approximately 90 degrees is formed between the light beam incident on the deflection geometry and the emerging light beam), such that the light is guided substantially laterally, and at an end surface of the light guiding structure 132, which can form a part of a side surface 154 of the smart card body 160 or can be near the side surface 154, can emerge from the light guiding structure 132 and from the smart card 300 through the optical region 140. Mutatis mutandis, this example can also hold true for an opposite light beam direction, that is to say for the case where the light is coupled, e.g. radiated, through the optical region 140 arranged at the side surface 154 into the light guiding structure 132 through the end surface thereof, is deflected at the deflection geometry 134, is passed on through a base surface of the opening 144 and a main surface of the smart card module 100 toward the optoelectronic component 104 and is detected by the optoelectronic component 104. In this example, the optical region 140 can be arranged alongside the smart card module receptacle region 144, and thus alongside the contact array 116, on a side surface 154 of the smart card body 160.

In various embodiments, the smart card body 150, 160 can have more than one deflection geometry 134. By way of example, as illustrated e.g. in FIG. 2A, the smart card body 150 can have in each case at least one deflection geometry 134 which deflects the light before and/or after guiding by the light guiding structure 132. This combination of more than one deflection geometry 134 can enable the light to be deflected by approximately 180 degrees, for example. By way of example, such pairwise arrangement of the deflection geometries 134 (which can be configured for example as described above, such that the incident light experiences a deflection of approximately 90 degrees at each of the deflection geometries, and can furthermore be arranged with respect to one another such that the deflections add up to approximately 180 degrees) can make it possible for the optical region 140 to be arranged alongside the smart card module receptacle region 144 on the first card side 146. By way of example, the smart card module 100 can be arranged in the smart card module receptacle region 144, and thus alongside the optical region 140, such that the at least one optoelectronic component 104, for example an LED 104, emits light substantially in the direction toward the second card side 148. By the deflection by approximately 180, the light from the LED 104 can be coupled out, e.g. emitted, through the optical region 140 arranged alongside the smart card module receptacle region 144 on the first card side 146.

In various embodiments, the deflection geometries 134 can be arranged e.g. pairwise such that the optical region 140 can be arranged on the second card side 148. The optical region 140 can in this case be situated in a partial region of the second card side 148 which does not or substantially does not lie below the smart card module 144. To put it another way, the light guiding structure 132 can be used to shift an emission taking place in the direction toward the second card side 148 on the second card side 148, such that the optically coupled optical region 140 through which the emission out of the smart card body takes place does not lie directly below the LED 104.

In various embodiments, the smart card body 150, 160 can have at least one mask 136. The mask 136 can be configured in layer form. The mask 136 can be arranged between the first coupling region 244 and the optical region 140. The mask 136 can be formed from a material or include a material which is not transparent, for example not transparent to electromagnetic radiation in the UV, visual and IR wavelength range, or for example not transparent to at least one subrange of said wavelength range.

The mask 136 can be structured. By way of example, the mask can have at least one opening (see e.g. FIG. 3A and FIG. 3B) in which the material of the mask 136 is removed or was not formed. In the at least one opening, the mask can be transparent to the electromagnetic radiation which is blocked by the material of the mask 136. If a plurality of openings are present, these can be arranged in the form of a symbol, for example as mask 136 for numerals. FIG. 3A and FIG. 3B depict examples of masks in which an arrangement of the openings reproduces contours of the numeral "8" such that a stylized display of all numerals from 0 to 9 is possible.

The mask 136 can be formed from or predominantly consist of a nontransparent material, for example, and the at least one opening can be formed by stamping-out, for example.

The mask 136 can be formed from or predominantly consist of a transparent material, for example, and the at least one opening can be formed for example by the nontransparent material being applied, e.g. coated, onto the transparent material of the mask 136, wherein the opening is not coated with the nontransparent material or the nontransparent material is removed again after being applied.

In various embodiments, the mask 136 can be used to prevent light which might emerge from the optical region 140 at undesired locations, for example at locations which cannot be assigned to a symbol to be represented, from being coupled out from the optical region 140. To put it another way, the mask 136 can serve to restrict the coupling-out of the light from the optical region 140 to the at least one opening of the mask 136.

The mask 136 can be of integral design. The mask 136 may include or essentially consist of a plurality of mask parts, and/or the mask 136 may include or essentially consist of a plurality of mask layers.

In various embodiments, the smart card body 150, 160 can have at least one further mask (not illustrated). The further mask can be arranged between the second coupling region 240 and the optoelectronic component 104.

The further mask can be similar to the mask 136 (e.g. with regard to material, production, shape, etc.). The further mask can serve, for example, for coupling out the light emitted by the optoelectronic component 104 from the smart card body only by desired regions, e.g. by the light guiding structure 132.

The further mask can be formed for example by the metal coating of the light guiding structure 132.

The smart card module 100 can be arranged in the opening 144 such that the contact array 116 of the smart card module 100 faces a first card side 146 of the smart card body 150, 160. The smart card module 100 can be arranged in the opening 144 such that the contact array 116 of the smart card module 100 does not project or does not significantly project beyond an outermost surface of the smart card body 150, 160 facing the first card side 146, for example a surface of the first polymer layer 142 or a surface of an additional layer 152 (arranged above the first polymer layer), for example of a thin protective layer 152 composed of a polymer. To put it another way, the opening 144 can have lateral dimensions which are large enough to enable the smart card module 100 to be arranged therein and the first polymer layer 142, or if appropriate a layer stack which may include the first polymer layer 142 and, if appropriate, an additional layer 152 and/or one or a plurality of additional layers which can have the opening 144, can have a thickness which is sufficient in order that the smart card module 100 can be arranged therein such that the contact array 116 terminates in a planar fashion substantially with the outermost surface of the smart card body 150, 160 facing the first card side 146.

In various embodiments, the contact array 116 can be exposed, that is to say can be contactable from outside the smart card 200.

The chip 102 can be configured such that, as a reaction to an electrically conductive contact by the contact array 116, e.g. to a signal communicated by the electrically conductive contact, said chip controls the at least one optoelectronic component 104 by open-loop and/or closed-loop control. In the case of an emitting optoelectronic component, e.g. an LED, the chip can drive for example one or a plurality of the at least one optoelectronic component 104 such that it/they emits/emit light. In the case of an absorbing optoelectronic component, e.g. a photoreceiver, the chip can drive for example one or a plurality of the at least one optoelectronic component 104 such that it/they is/are ready to absorb light and to provide a detection signal corresponding to the absorbed light.

Moreover, the chip 102 can be configured such that, as a reaction to a signal communicated by inductive coupling, for example by the booster antenna 122 and the antenna 108, said chip controls the at least one optoelectronic component 104 by open-loop and/or closed-loop control. In the case of an emitting optoelectronic component, e.g. an LED, the chip can drive for example one or a plurality of the at least one optoelectronic component 104 such that it/they emits/emit light. In the case of an absorbing optoelectronic component, e.g. a photoreceiver, the chip can drive for example one or a plurality of the at least one optoelectronic component 104 such that it/they is/are ready to absorb light and to provide a detection signal corresponding to the absorbed light.

The light beam 128 illustrated in FIG. 2A and FIG. 2B can be part of the light which is emitted or absorbed by the optoelectronic component 104 on account of the optoelectronic component 104 being driven by the chip 102.

FIG. 2A illustrates the path of the light beam 128 for both possible beam directions (indicated by the double-headed arrow).

The following light path results for an emitting optoelectronic component 104 (for example an LED):

The light beam 128 can be emitted by the optoelectronic component 104, for example, in the direction toward the second card side 148 and can be coupled into the light guiding structure 132 through the encapsulation layer 118 of the smart card module 100, the transparent adhesion medium and the transparent layer 124 by the second coupling region 240, wherein the light beam 128 can move through the first coupling region 240 approximately perpendicularly to the first main side of the light guiding structure 132. The light beam 128 can thereupon be deflected by the deflection geometry 134 by approximately 90 degrees, such that the light beam 128 moves approximately parallel to the first and second main sides 131, 133 of the light guiding structure 132, wherein the light beam 128 can, however, form such a (small) angle with a parallel to the main sides 131, 133 that it can be reflected or subjected to total internal reflection in the light guiding structure 128 at the first and/or the second main side 131, 133. Upon impinging on a further deflection geometry 134, the light beam 128 is again deflected by approximately 90 degrees, such that the light beam 128 thereupon moves approximately perpendicularly to the first and second main sides 131, 133 and to the first and second card sides 146, 150. The light beam 28 can be coupled out of the light guiding structure 132 by the first coupling region 244 and can move through the transparent layer 124, the transparent mediator structure 138, the mask 136 and a transparent protective layer 156 to the optical region 140, where the light beam 128 can be coupled out of the smart card body 150.

The following light path results for an absorbing optoelectronic component 104 (for example a photoreceiver): the light beam 128 can be coupled into the smart card body 150 for example in the optical region through the transparent protective layer 156. The light beam 128 can be coupled into the light guiding structure 132 through the mask 136, the transparent mediator structure 138 and the transparent layer 124 by the first coupling region 244, wherein the light beam 128 can pass approximately perpendicularly to the first main side 131 of the light guiding structure 132 through the first coupling region 244. The light beam 128 can thereupon be deflected by the deflection geometry 134 by approximately 90 degrees, such that the light beam 128 moves approximately parallel to the first and second main sides 131, 133 of the light guiding structure 132, wherein the light beam 128 can, however, form such a (small) angle with a parallel to the main sides 131, 133 that it can be reflected or subjected to total internal reflection in the light guiding structure 128 at the first and/or the second main side 131, 133. Upon impinging on a further deflection geometry 134, the light beam 128 is again deflected by approximately 90 degrees, such that the light beam 128 thereupon moves approximately perpendicularly to the first and second main sides 131, 133 and to the first and second card sides 146, 150. The light beam 128 can be coupled out of the light guiding structure 132 by the second coupling region 240 and can move through the transparent layer 124, the adhesion medium layer 130 and the encapsulation layer 118 to the optoelectronic component 104 (e.g. the photoreceiver), where it can be absorbed and detected by the optoelectronic component 104.

FIG. 2B also illustrates the path of the light beam 128 for both beam directions.

The following light path results for an emitting optoelectronic component 104 (for example an LED):

The light beam 128 can be emitted by the optoelectronic component 104, for example, in the direction toward the second card side 148 and can be coupled into the light guiding structure 132 through the encapsulation layer 118 of the smart card module 100, the transparent adhesion medium and the transparent layer 124 by the second coupling region 240, wherein the light beam 128 can move through the first coupling region 240 approximately perpendicularly to the first main side of the light guiding structure 132. The light beam 128 can thereupon be deflected by the deflection geometry 134 by approximately 90 degrees, such that the light beam 128 moves approximately parallel to the first and second main sides 131, 133 of the light guiding structure 132, wherein the light beam 128 can, however, form such a (small) angle with a parallel to the main sides 131, 133 that it can be reflected or subjected to total internal reflection in the light guiding structure 128 at the first and/or the second main side 131, 133. At an end surface of the light guiding structure, which can form a part of the side surface 154 of the smart card body 160, the light beam 128 can be coupled out of the light guiding structure 132 and the smart card body 160 by the optical region 140.

The following light path results for an absorbing optoelectronic component 104 (for example a photoreceiver):

The light beam 128 can be coupled into the light guiding structure 100 for example in the optical region 140 at the side surface 154 of the smart card body 160. The light beam 128 can move approximately parallel to the first and second main sides 131, 133 of the light guiding structure 132, wherein the light beam 128 can, however, form such a (small) angle with a parallel to the main sides 131, 133 that it can be reflected or subjected to total internal reflection in the light guiding structure 128 at the first and/or the second main side 131, 133.

Upon impinging on a further deflection geometry 134, the light beam 128 is again deflected by approximately 90 degrees, such that the light beam 128 thereupon moves approximately perpendicularly to the first and second main sides 131, 133 and to the first and second card sides 146, 150. The light beam 128 can be coupled out of the light guiding structure 132 by the second coupling region 240 and can move through the transparent layer 124, the adhesion medium layer 130 and the encapsulation layer 118 to the optoelectronic component 104 (e.g. the photoreceiver), where it can be absorbed and detected by the optoelectronic component 104.

In addition to the layers described, the smart card body 150, 160 may include one or a plurality of further layers, for example protective layers, printable layers, transparent layers, adhesion medium layers, adhesion promoter layers, shields, etc.

In the case of nontransparent layers, the layers, in regions in which they are intended to be transparent, can be processed in such a way that they are transparent in those regions. By way of example, the layers can be stamped out in those regions and be filled, if appropriate, with a transparent material, for example a transparent polymer. The transparent material, in the same way as the nontransparent layer, can combine with adjacent layers during a process of connecting the smart card, for example during a laminating process.

FIG. 3A illustrates various embodiments of the smart card 200 and of the smart card body 150 illustrated in FIG. 2A as perspective views of individual structures of the smart card 200 and of the smart card body 150.

FIG. 3B illustrates various embodiments of a smart card 400 and of a smart card body as perspective views of individual structures of the smart card and of the smart card body, wherein the smart card 400 and the smart card body of the smart card 400 can substantially—apart from an arrangement of the optoelectronic components, the second coupling regions 240 and the light guiding paths 242—correspond to the structures illustrated in FIG. 3A. Illustrated and also non-illustrated structures, materials, etc. can correspond to the structures, materials, etc. described in association with FIG. 2A.

As is illustrated in FIG. 3A and FIG. 3B, the smart card body 150 can have in each case a plurality of first coupling regions 244 and/or a plurality of second coupling regions 240. Each of the coupling regions can be assigned a deflection geometry 134, such that the smart card body 150 can have in each case a plurality of deflection geometries 134 which deflect the light prior to guiding by the light guiding structure 132, and/or a plurality of deflection geometries 134 which deflect the light after guiding by the light guiding structure 132.

In each case a first coupling region 244 and a second coupling region 240 can be optically coupled to one another by a part of the light guiding structure 132, for example by a light guiding path 242. To put it another way, each pair of coupling regions 244, 240 can be optically coupled by a dedicated assigned light guiding path 242 which is part of the light guiding structure 132. Consequently, as indicated on the basis of arrows in FIG. 3A, light emitted by one of the plurality of optoelectronic components 104 can be coupled into one of the second coupling regions 240, can be deflected there by the deflection geometry 134 (not illustrated in FIG. 3A), can move along the light guiding path 242, wherein the light can be deflected (e.g. reflected or subjected to total internal reflection) at main sides 131, 133 and/or at side surfaces of the light guiding structure 132 (of the light guiding path 242). At a further deflection geometry (not illustrated), the light can be deflected such that it moves through a transparent opening of the mask 136 in the direction toward the optical region 140 and can be coupled out through the latter.

In various embodiments, the light guiding structure 132 may include an individual layer. In other embodiments, the light guiding structure 132 may include a plurality of layers, for example for a representation of a more complex display.

In various embodiments, the plurality of second coupling regions 240 can have an arrangement which is similar to an arrangement of the plurality of first coupling regions 244. By way of example, the plurality of second coupling regions 240 and the plurality of first coupling regions 244 can be arranged substantially symmetrically, for example mirror-symmetrically or translationally symmetrically (e.g. substantially identically).

By way of example, light can be coupled out from the optical region 140 in a structured fashion such that information is represented, for example one or a plurality of numerals. The first coupling regions 244 and the openings in the mask 136 can be arranged, for example a respective one of the first coupling regions 244 can be assigned to one of the openings in the mask 136, such that every part of a contour of a representable stylized numeral can be illuminated by light from one of the first coupling regions 244. By way of example, the openings (seven openings in the example) of the mask 136 can be arranged such that they form a numeral "8". For representing the numeral "8", all the openings can be illuminated, i.e. the light can be coupled out from the optical region 140 through all the openings of the mask 136. For representing other numerals, not all the openings of the mask 136 are illuminated; by way of example, a central opening can be unilluminated if a "0" is represented.

A different, e.g. more complex, arrangement of openings can be formed for a representation of other symbols, letters or the like.

In each case one of the first coupling regions 244 can be assigned to one of the openings, and an arrangement of the first coupling regions 244 can correspond to an arrangement of the openings. By way of example, one of the first coupling regions 244 can be arranged substantially directly below each opening. The first coupling regions 244 can thus also be arranged for example in the form of a numeral "8".

A second coupling region 240 can be optically coupled to each of the first coupling regions 244, for example by the light guiding path 242. The second coupling regions 240 can be arranged such that they substantially reproduce the arrangement of the first coupling regions 244. By way of example, the second coupling regions 240 can also be arranged in the form of a numeral "8". The arrangement of the first coupling regions 240 can be substantially, for example according to the structure, symmetrical with respect to the arrangement of the second coupling regions 244, for example mirror-symmetrical. Size ratios can also be part of the symmetry, i.e. for example distances between the first coupling regions 240 among one another and distances between the second coupling regions among one another, and/or sizes of the first coupling regions 244 and of the second coupling regions 240 can be identical. To put it another way, as illustrated in FIG. 3A, the arrangement of the second coupling regions 240 can be of substantially just the same size as the arrangement of the first coupling regions 244. In various embodiments, merely a relative position of the first coupling regions 244 and of the second coupling regions can be embodied symmetrically with respect to one another; by way of example, distances between the first coupling regions 240 among one another and distances between the second coupling regions among one another, and/or sizes of the first coupling regions 244 and of the second coupling regions 240 can be different. To put it another way, the arrangement of the second coupling regions 240 can be of a different size than the arrangement of the first coupling regions 244. By way of example, the arrangement of the second coupling regions 240 can be smaller or larger than the arrangement of the first coupling regions 244.

The plurality of optoelectronic components 104 can be arranged relative to the first coupling regions 240, for example above them, such that a large part of the light emitted by the respective optoelectronic component 104 can be coupled into the assigned first coupling region 240, situated for example directly underneath. That part of the light emitted by the respective optoelectronic component which can be coupled into the assigned coupling region 240 can be for example at least 40%, for example at least 50%, at least 60%, at least 70%, at least 80% or at least 90%.

In the case of the second coupling regions 240 arranged substantially symmetrically with respect to the coupled-out light, the plurality of optoelectronic components 104, for example LEDs 104, can likewise be arranged substantially symmetrically with respect to the coupled-out light, for example mirror-symmetrically or translationally symmetrically (e.g. substantially identically).

In various embodiments, the optoelectronic components 104 in the smart card module 100 can be arranged in the form of the numeral "8". For representing different numerals, in each case one or a plurality of the optoelectronic components 104 can be driven to emit by the chip 102.

To put it another way, the light guiding structure 132 can be used to project a display of the plurality of optoelectronic components, e.g. of an LED display, to a different location of the smart card 200, 300, for example to the optical region 140, which can be arranged e.g. on the first card side 146 alongside the smart card module 100, alongside the contact array 116 and/or alongside the smart card module receptacle region 144, or for example on the second card side 148.

The description regarding FIG. 3A can also hold true, mutatis mutandis for an opposite light beam direction and an absorbing optoelectronic component 104.

As is illustrated in FIG. 3B, in various embodiments, the plurality of second coupling regions 240 can have an arrangement which is different than an arrangement of the plurality of first coupling regions 244.

By way of example, the arrangement of the first coupling regions 244 can correspond to the arrangement illustrated in FIG. 3A and described in association therewith. The arrangement of the second coupling regions 240, by contrast, can be configured such that the second coupling regions 240 are arranged adjacently for example in a one-dimensional or two-dimensional arrangement. By way of example, a configuration of the individual second coupling regions 240 and their distances from one another can be designed such that an optical coupling between the individual second coupling regions 240 does not actually occur, or occurs only negligibly. By way of example, the individual second coupling regions 240 can be arranged linearly, e.g. in a series, and can be optically coupled to the light guiding structure 132, e.g. to the plurality of light guiding paths 242. Each of the light guiding paths can be optically coupled to one of the first coupling regions 244.

At least one optoelectronic component 104 can be arranged, e.g. above the arrangement of the second coupling regions 240, such that the light emitted by the optoelectronic component 104 can be coupled into the second coupling regions 240. If only one optoelectronic component 104 is present, the optoelectronic component 104 can be arranged such that the light emitted by it can be coupled into the plurality of second coupling regions 240. If two or more optoelectronic components 104 are present, they can be arranged such that the light of each individual optoelectronic component 104 is not coupled into all the second coupling regions 240. By way of example, the light of a respective optoelectronic component 104 can be coupled into exactly one of the second coupling regions 240 or into two or more of the second coupling regions 240.

The optoelectronic components 104 can be arranged in an arrangement which is similar to the arrangement of the second coupling regions 240, for example in the form of a line if the second coupling regions 240 are formed as a line, for example as a one-dimensional LED array, or generally as an array of, for example, n rows and m columns, wherein n can be a natural number, for example 1, 2, 3, 4 or more, and m can be a natural number, for example 1, 2, 3, 4 or more.

For guiding the light of a one-dimensional array of optoelectronic components (e.g. LEDs) 104 to the optical region 140, it can suffice to use a monolayer light guiding structure 132.

In various embodiments, the optoelectronic components 104 and the second coupling regions 240 can be configured in any other arrangements.

The various embodiments illustrated in FIG. 3B can be understood such that a display of optoelectronic components 104 whose arrangement can be technically advantageous, for example, can be resorted by the light guiding structure 132 and coupled out, e.g. displayed, in an optical region, thus resulting in information recognizable by a user, e.g. a symbol recognizable by the eyes, or information that can be evaluated by a suitable device.

Each of the optoelectronic components 104 can be driven by the chip 102, such that optical information can be transferred between the at least one optoelectronic component 104 and the optical region 140.

In various embodiments, the light guiding paths 242 can be part of the light guiding structure 132. The light guiding structure 132 can be formed for example by embossing, e.g. by hot embossing. The hot embossing or embossing can be carried out e.g. from both sides of the light guiding structure 132. Alternatively, lithographic methods, pattern transfer methods or other suitable methods can be used for shaping the light guiding structure 132.

By way of example, a film composed of light guiding structure material can be shaped such that the light guiding paths 242, the coupling regions 240, 244, and the deflection geometries 134 are formed as thickened, e.g. elevated, structures, whereas other regions of the light guiding structure 132, for example the regions between the light guiding paths 242, can be embodied as thin film and/or can be stamped out, for example partly. The exemplary values indicated above for the thickness of the light guiding structure 132 can relate in this case to a thickness of the thickened or elevated structures. A thickness of the thin, filmlike regions outside and between the thickened structures can be a fraction of the thickness of the thickened structures; by way of example, the fraction can be between approximately one twentieth and one third.

The light guiding structure 132, e.g. the light guiding paths 242, can be embedded into or coated with a material, for example a transparent polymer, which has a lower refractive index than the material of the light guiding structure 132. The light can then be guided within the light guiding structure 132 by total internal reflection.

The light guiding structure 132, e.g. the light guiding paths 242, can be coated with a reflective material, e.g. a metal or a dielectric layer or a dielectric layer stack. The light can then be guided within the light guiding structure 132 by reflection.

The light guiding structure 132 or the light guiding paths 242 can be shaped such that loss of light is avoided. In the case where total internal reflection is used to guide the light along the light guiding structure 132, for example curvatures having a small radius of curvature, sharp bends and the like can have the effect that, for part of the light guided within the light guiding structure 132, a condition for total internal reflection, i.e. impingement on the first or the second main side 131 or 133 or on the side surface of the light guiding structure 132 at an angle of incidence that is greater than a critical angle of total internal reflection to be calculated in accordance with known light refraction laws (in this respect, also see FIG. 4), is not met. In that case, light could emerge from the light guiding structure 132. Small radii of curvature, (sharp) bends, etc. in the light guiding structure should therefore be avoided.

The description regarding FIG. 3B can also hold true, mutatis mutandis, for an opposite light beam direction and an absorbing optoelectronic component 104.

FIG. 4 shows a schematic illustration of a total internal reflection.

During a transition of electromagnetic radiation at an interface from a medium, for example a transparent polymer, having a higher refractive index n1 to a medium, for example a transparent polymer or air, having a lower refractive index n2, the light (in each case a rear part of the arrows that is labeled with "100" in FIG. 4) can be split into a reflected part (white arrow tips pointing in the direction of the polymer) and transmitted part (black arrow tips pointing away from the polymer). As the angle of incidence increases (where the angle of incidence is defined as an angle formed between the light incident on the interface and a normal to the interface), the proportion of reflected light rises and the proportion of transmitted light falls until a critical angle $\Theta_G=\arcsin(n2/n1)$ is reached, above which substantially all of the light is reflected.

Figure 5A:
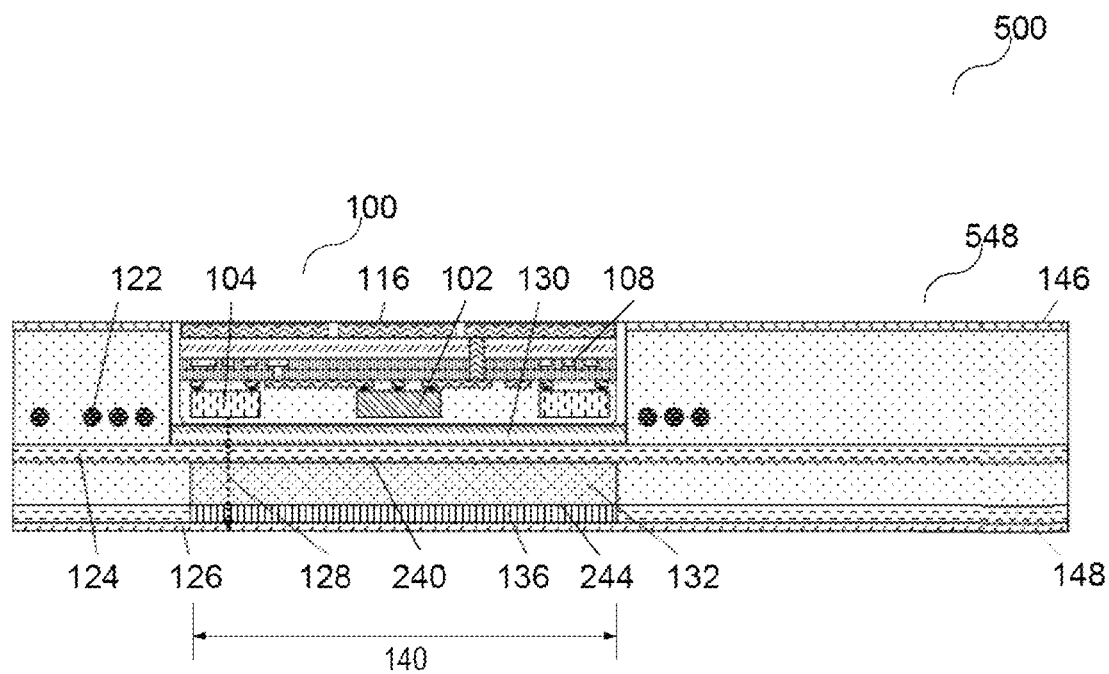
FIG. 5A shows a cross-sectional view of a smart card in accordance with various embodiments.

FIG. 5A shows a cross-sectional view of a smart card 500 in accordance with various embodiments.

The smart card 500 may include a smart card body 548 and a smart card module 100. The smart card module 100 can substantially correspond to the smart card module 100 described in association with FIG. 1.

Layers, component parts, materials, production, etc. of the smart card body 548 can predominantly, unless described differently here, correspond to the layers, component parts, materials, production, etc. described in association with FIGS. 2A, 2B, 3A and 3B.

In contrast to the previous embodiments, the smart card body 548 can have a light guiding structure 132 which is not used to guide light emitted by the at least one optoelectronic component 104 arranged on a smart card module 100 laterally in the smart card body 548, for example by reflection or total internal reflection, rather which transmits the light coupled in through a second coupling region 240 (a light beam 128 is depicted by way of example in FIG. 5A) in the direction toward a first coupling region 244 and toward an optical region 140. A mask 136 can be arranged between the first coupling region 244, the smart card module 100 can be arranged in a smart card module receptacle region 144 by a transparent adhesion medium 130, and a layer 124 can be arranged between the light guiding structure 132 and the optoelectronic component 104 (or between the light guiding structure 132 and the adhesion medium 130), said layer being transparent at least between the at least one optoelectronic component 104 and the light guiding structure 132. On a second card side 148, the smart card body 548 and thus also the smart card 500 can have a protective layer 126, which can be configured as transparent at least above the mask 136 (illustrated in a manner lying below the mask 136 in FIG. 5A).

In various embodiments, a material of the light guiding structure 132 may include or essentially consist of a polymer, for example a transparent polymer, for example a thermoplastic, for example PCB, for example PCB of optical quality.

In various embodiments, a length and a width of the light guiding structure 132 can correspond for example to a length and a width of the smart card module 100. In various embodiments, the length and the width of the light guiding structure 132 can be chosen such that substantially all of the light which is emitted by the at least one optoelectronic component 104 can be coupled into the light guiding structure 132 through the second coupling region 240.

In various embodiments, the light guiding structure 132 can be designed as a multipartite light guiding structure 132. In the case of the example depicted in FIG. 5A, for example, a region of the light guiding structure 132 below the chip 102 could be embodied for example as a nontransparent polymer layer rather than as light guiding structure 132. Two separate parts of the light guiding structure 132 would thus be formed, one on the left and one on the right of the part of the polymer layer below the chip 102.

The description regarding FIG. 5A can also hold true, mutatis mutandis, for an opposite light beam direction and an absorbing optoelectronic component 104.

Figure 5B:
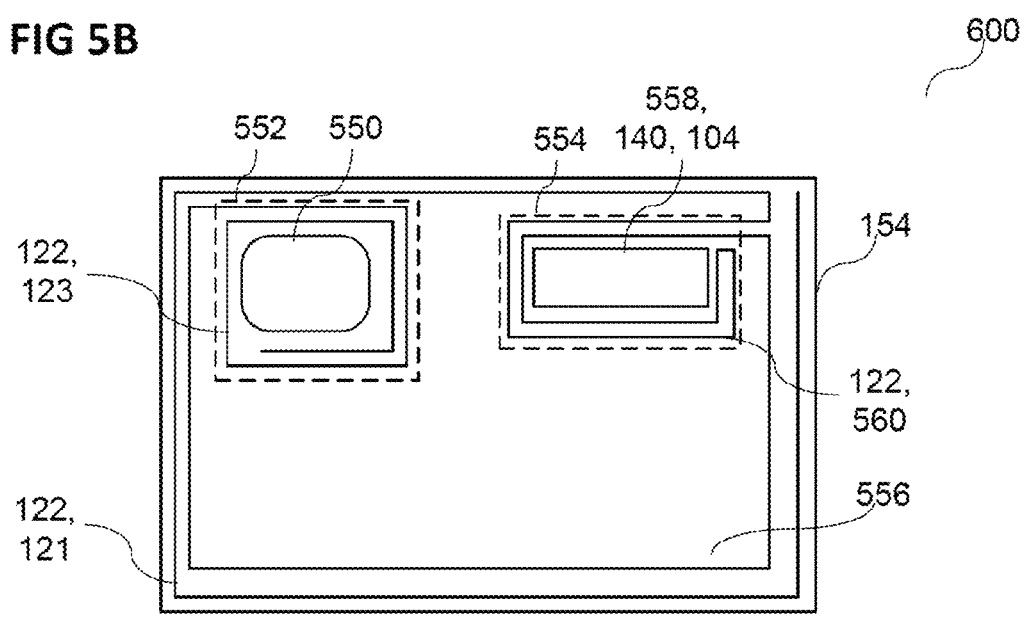
FIG. 5B shows a plan view of a smart card in accordance with various embodiments.

FIG. 5B illustrates a plan view of a smart card 600 in accordance with various embodiments.

The smart card 600 may include a smart card body 556 and a smart card module 550. Layers, component parts, materials, production, etc. of the smart card body 556 and of the smart card module 550 can predominantly, unless described differently here, correspond to the layers, component parts, materials, production, etc. described in association with FIGS. 2A, 2B, 3A, 3B and 5A.

In contrast to the previous embodiments, the smart card 600 may include a smart card module 550 which can differ from the smart card module 100 in that it does not comprise an optoelectronic component 104.

Instead, at least one optoelectronic component 104 can be arranged near an optical region 140 for emitting electromagnetic radiation, for example as part of a display unit 558, for example of an LED display. The optoelectronic component 104 can be a light emitting component 104, for example. The light emitting component 104 can be optically coupled to the optical region 140.

In various embodiments, the display unit 558 may include a control device (not illustrated) or can be electrically, for example electrically conductively, coupled to the control device. The control device may include or essentially consist of a second chip, for example. The second chip can be electrically conductively connected to the optoelectronic component 104 of the display unit.

To put it another way, the optical display unit 558 may include the at least one light emitting component 104 electrically conductively connected to the chip and optically coupled to an optical region 140 for emitting or absorbing the electromagnetic radiation, such that the light emitted by the light emitting component 104 is output, e.g. emitted, by the optical region.

In various embodiments, the optical display unit 558 can be arranged alongside a smart card module receptacle region in which the smart card module 550 can be arranged. By way of example, the optical display unit 558 can be arranged on or above a first card side 146 of the smart card 600 or of the smart card body 556.

The display unit 558 may furthermore include a second antenna (not illustrated). The second antenna can be electrically conductively connected to the second chip. The second antenna can substantially correspond to the antenna 108 of the smart card module 100.

The second antenna can be configured such that it is electrically, for example inductively, coupled to a booster antenna 122 arranged in the smart card body 556. The second antenna can be configured such that it takes up energy by the inductive coupling to the booster antenna 122, for example for operation of the display unit 558.

The booster antenna 122 can be arranged at least partly (identified by 122, 121) in edge regions of the smart card body 556, that is to say near side surfaces 154 of the smart card body 556. The booster antenna 122 can be embodied at least partly (identified by 122, 123) near the smart card module 100. The booster antenna 122 can thus form a first inductive coupling region 552 for inductive coupling to the first antenna (for example illustrated as antenna 108 in FIG. 1).

In various embodiments, the booster antenna 122 can have a second inductive coupling region 554 for inductive coupling to the second antenna. For this purpose, the booster antenna 122 can be embodied at least partly (identified by 122, 560) near the display unit 558 (and thus near the second antenna).

The display unit may furthermore include a mask, a supporting structure, one or a plurality of color filters or the like.

Figure 6:
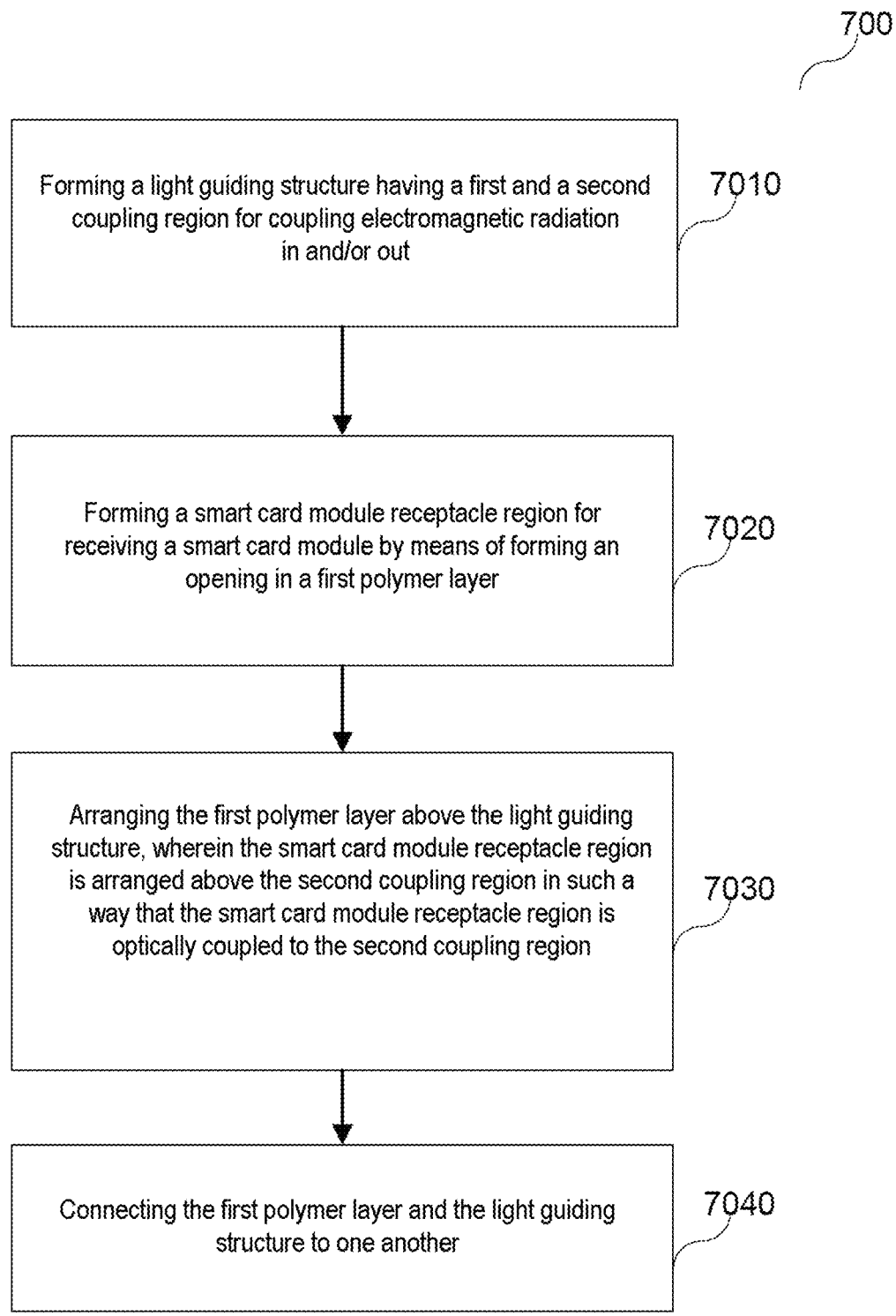
FIG. 6 shows a flow chart illustrating a method for producing a smart card.

FIG. 6 shows a flow chart 700 illustrating a method for producing a smart card.

In various embodiments, the method for producing a smart card may include forming a light guiding structure having a first and a second coupling region for coupling electromagnetic radiation in and/or out (in 7010). The method may furthermore include forming a smart card module receptacle region for receiving a smart card module by forming an opening in a first polymer layer (in 7020), and arranging the first polymer layer above the light guiding structure, wherein the smart card module receptacle region is arranged above the second coupling region in such a way that the smart card module receptacle region is optically coupled to the second coupling region (in 7030), and connecting the first polymer layer and the light guiding structure to one another (in 7040).

In various embodiments, forming the light guiding structure may include shaping a polymer layer. The polymer may include or essentially consist of a transparent polymer, for example. Shaping may include embossing and/or hot embossing, for example.

The shaped polymer layer can be coated, for example by a metal layer or by a polymer layer.

The light guiding structure can be connected to the first polymer layer in order to form the smart card. At the same time, further layers, for example polymer layers, can be connected to one another and/or to the first polymer layer and/or to the light guiding structure in order to form the smart card. Connecting the first polymer layer and the light guiding structure may include laminating, for example.

In various embodiments, smart cards 200, 300, 400, 500, 600 including emitting optoelectronic components 104 (and smart card bodies 150, 160 for use therewith) have been described, the light of which is guided by the light guiding structure 132 to the optical region 140 and is coupled out there. In further embodiments, smart cards 200, 300, 400, 500 including absorbing optoelectronic components 104 (and smart card bodies 150, 160 for use therewith) have been described, the light of which is fed by the light guiding structure 132 from the optical region 140 into which the light is coupled. Unless described otherwise, for every embodiment it is also possible to reverse the light beam direction, together with an exchange of an emitting optoelectronic component 104 and an absorbing optoelectronic component 104.

Further advantageous configurations of the method are evident from the descriptions of the sensor device, and vice versa.

In various embodiments, a smart card may be provided which includes the functionalities of wireless and contact based communication and of a display.

In various embodiments, a smart card may include a first smart card module having a control device, e.g. a chip, and a contact interface and a second module having a second control device, e.g. a chip, and a display device, and the first smart card module and/or the second module may furthermore be designed as wireless interface. The module having the display device may be embedded into the smart card. The control device of the smart card module may be configured for example such that it can control security-relevant processes. Such a control device is also designated as security controller.

In various embodiments, a smart card may include a smart card module having a control device, e.g. a chip, a wireless interface and a display device. Furthermore, the smart card may include a contact interface. The contact interface may include a contact array. The control device can be electrically, for example electrically conductively, connected to the contact array. The contact array can be integrated in the smart card module.

The contact array, which can be part of the smart card module, for example, can be connected to a card body only after the card body has been completed. The contact array can be introduced for example into an opening, for example into a cutout, in the card body. An electrical connection, for example an electrically conductive connection, of the contact array, e.g. to an antenna arranged in the card body, also designated as booster antenna, for the wireless communication and/or to the second module, can be provided for example by soldering, welding or a flexible contacting of an elevated contact region, of a so-called "flexible bump". The contact array, e.g. the smart card module having the contact array, can be fitted in the opening or in the cutout for example by an adhesion medium, for example an adhesive.

The opening can also be designated as smart card module receptacle region. In addition, the smart card module can be electrically conductively connected if appropriate by one or a plurality of electrical terminals to an electrical contact arranged in the smart card module receptacle region, and can be electrically conductively connected for example to a display device by the electrical contact.

In various embodiments, a second antenna can be arranged in the smart card module. The second antenna may include an electrically conductive connection to the chip. The second antenna can be configured such that it is inductively coupled to the booster antenna. To put it another way, the second antenna can be used to exchange information and energy between the second antenna (and thus the electrically conductively connected chip) and the booster antenna. As a result, an electrically conductive connection between the smart card module and the booster antenna, which could break for example in the event of mechanical loading of the smart card, can be dispensed with.

In various embodiments, a smart card can be designed such that it provides information in the form of electromagnetic radiation, for example by a display, for example by a display which is luminous in a visual wavelength range. The display can be implemented in a predetermined region, also designated as optical region, for example by a display device. The optical region can be arranged alongside the chip module receptacle region. The electromagnetic radiation can be provided by an optoelectronic component, for example by an LED. The optoelectronic component can be part of the smart card module. The optoelectronic component can be optically coupled to the optical region.

In various embodiments, a smart card can be designed such that it takes up information in the form of electromagnetic radiation, for example by enabling electromagnetic radiation, for example light in the visual, UV or infrared spectral range, to be radiated into a predetermined optical region. The smart card can be designed such that the electromagnetic radiation radiated in is fed to an optoelectronic component, for example a photoreceiver. The optoelectronic component can be part of the smart card module. The optoelectronic component can be optically coupled to the optical region. The optoelectronic component can absorb the electromagnetic radiation and provide a signal assigned to the absorbed radiation.

The optical coupling between the optoelectronic component and the optical region can be provided by a light guiding structure. The light guiding structure can be formed in layer form. In various embodiments, the display of the LED display can be projected onto the optical region by the light guiding structure. In various embodiments, electromagnetic radiation radiated into the optical region can be projected onto the optoelectronic component by the light guiding structure. The optical region can be arranged for example on the same side of the smart card as the contact array. In this embodiment, the production costs of the smart card can be low because only one control device is required (instead of two control devices) and the light guiding structure in layer form can easily be incorporated into a normal process for producing a smart card. Furthermore, the smart card can be robust because it does not have any electrically conductive connections susceptible to breaking, for example between the smart card module and the display device and/or between the smart card module and the booster antenna and/or between the smart card module and the contact array.

In various embodiments, a smart card module may include a chip, a contact array, a second antenna and at least one optoelectronic component.

In various embodiments, a smart card module is provided, which may include a carrier having a first main surface and a second main surface opposite the first main surface. The carrier may have at least one plated-through hole. The smart card module may furthermore include a contact array arranged above the first main surface of the carrier and having a plurality of electrical contacts. At least one electrical contact of the plurality of electrical contacts may be electrically connected to the plated-through hole. The smart card module may further include a chip arranged above the second main surface. The chip may be electrically coupled to at least one electrical contact of the plurality of electrical contacts by the plated-through hole. The smart card module may further include at least one optoelectronic component arranged above the second main surface and electrically conductively connected to the chip.

In one configuration, the smart card module may furthermore include an antenna contact for connecting an antenna, said antenna contact being electrically conductively connected to the chip.

In one configuration, the smart card module may furthermore include a first antenna electrically conductively coupled to the antenna contact.

In one configuration, the first antenna can be arranged above the second main surface.

In one configuration, the first antenna can be arranged on the second main surface.

In one configuration, the smart card module may furthermore include a layer arranged above the second main surface, wherein the layer may include the first antenna.

In one configuration, the optoelectronic component can be an electromagnetic radiation emitting component.

In one configuration, the optoelectronic component can be a light emitting diode (LED).

In one configuration, the optoelectronic component can be a photoreceiver.

In various embodiments, a smart card body is provided, which may include a smart card module receptacle region for receiving a smart card module. The smart card body may include an optical region for emitting or absorbing electromagnetic radiation, and also a light guiding structure, which can be optically coupled to the smart card module receptacle region, for receiving electromagnetic radiation which can be emitted or absorbed by an optoelectronic component of the smart card module. The light guiding structure can be designed to direct the electromagnetic radiation within the smart card body to or from a first coupling region, which is optically coupled to the optical region.

In one configuration, the optical region can be arranged alongside the smart card module receptacle region.

In one configuration, the light guiding structure can be formed as a layer.

In one configuration, at least one part of a surface of the light guiding structure can be reflectively coated.

In one configuration, the light guiding structure can be designed such that the electromagnetic radiation which it takes up impinges substantially perpendicularly on the layer of the light guiding structure.

In one configuration, the smart card body may furthermore include a booster antenna.

In various embodiments, a method for producing a smart card body is provided. The method may include forming a light guiding structure having a first and a second coupling region for coupling electromagnetic radiation in and/or out, and also forming a smart card module receptacle region for receiving a smart card module by forming an opening in a first polymer layer, arranging the first polymer layer above the light guiding structure, wherein the smart card module receptacle region is arranged above the second coupling region in such a way that the smart card module receptacle region is optically coupled to the second coupling region, and connecting the first polymer layer and the light guiding structure to one another.

In one configuration, forming the light guiding structure may include shaping a polymer layer.

In one configuration, shaping the polymer layer may include embossing and/or hot embossing.

In one configuration, forming the light guiding structure may include coating the polymer layer.

In one configuration, connecting the first polymer layer and the light guiding structure may include laminating.

In various embodiments, a smart card is provided. The smart card may include a smart card body having a smart card module receptacle region for receiving a smart card module and having an optical region alongside the smart card module receptacle region. The smart card may furthermore include a light guiding structure, which is optically coupled to the receptacle region, for taking up electromagnetic radiation which is emitted or absorbed by an optoelectronic component of the smart card module. The light guiding structure is designed to guide the electromagnetic radiation within the smart card body to or from a coupling region, which is optically coupled to the optical region. The smart card may furthermore include a smart card module arranged in the smart card module receptacle region.

In various embodiments, a smart card is provided. The smart card may include a smart card body having a smart card module receptacle region and an optical display unit, and also a smart card module arranged in the smart card module receptacle region. The smart card module may include a carrier having a first main surface and a second main surface opposite the first main surface. The carrier has at least one plated-through hole, and also a contact array arranged above the first main surface of the carrier and having a plurality of electrical contacts. At least one electrical contact of the plurality of electrical contacts is electrically connected to the plated-through hole, a chip arranged above the second main surface. The chip is electrically coupled to at least one electrical contact of the plurality of electrical contacts by the plated-through hole. The smart card may further include an antenna electrically conductively coupled to the chip. The smart card may furthermore include a booster antenna having an inductive coupling region for inductive coupling to the antenna of the smart card module, and also at least one light emitting component electrically conductively connected to the chip and optically coupled to the optical region, such that light emitted by the light emitting component is output by the optical region.

In one configuration, the optical display unit can be arranged alongside the smart card module receptacle region.

In one configuration, the light emitting component may include a second chip and a second antenna electrically conductively coupled to the second chip, and the booster antenna may include a second inductive coupling region for inductive coupling to the second antenna.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A smart card module, comprising:
   a carrier having a first main surface and a second main surface opposite the first main surface, wherein the carrier has at least one plated-through hole;
   a contact array arranged above the first main surface of the carrier and having a plurality of electrical contacts, wherein at least one electrical contact of the plurality of electrical contacts is electrically connected to the plated-through hole;
   a chip arranged above the second main surface, wherein the chip is electrically coupled to at least one electrical contact of the plurality of electrical contacts by the plated-through hole; and
   at least one optoelectronic component arranged above the second main surface and electrically conductively connected to the chip.

2. The smart card module as claimed in claim 1, further comprising:
   an antenna contact for connecting an antenna, said antenna contact being electrically conductively connected to the chip.

3. The smart card module as claimed in claim 2, further comprising:
   an antenna electrically conductively coupled to the antenna contact.

4. The smart card module as claimed in claim 3,
   wherein the antenna is arranged on or above the second main surface.

5. The smart card module as claimed in claim 1, further comprising:
   a layer arranged above the second main surface, wherein the layer comprises the antenna.

6. The smart card module as claimed in claim 1,
   wherein the optoelectronic component is an electromagnetic radiation emitting component.

7. The smart card module as claimed in claim 6,
   wherein the optoelectronic component is an LED.

8. The smart card module as claimed in claim 6,
   wherein the optoelectronic component is a photoreceiver.

9. A smart card body, comprising:
   a smart card module receptacle region for receiving a smart card module;
   an optical region for emitting or absorbing electromagnetic radiation; and
   a light guiding structure, which is optically coupled to the smart card module receptacle region, for taking up electromagnetic radiation which is emitted or absorbed by an optoelectronic component of the smart card module,
   wherein the light guiding structure is designed to guide the electromagnetic radiation within the smart card body to or from a first coupling region, which is optically coupled to the optical region.

10. The smart card body as claimed in claim 9,
    wherein the optical region is arranged alongside the smart card module receptacle region.

11. The smart card body as claimed in claim 9,
    wherein the light guiding structure is formed as a layer.

12. The smart card body as claimed in claim 9,
    wherein a surface of the light guiding structure is at least partly reflectively coated.

13. The smart card body as claimed in claim 9,
    wherein the light guiding structure is designed such that the electromagnetic radiation which it takes up impinges substantially perpendicularly on the layer of the light guiding structure.

14. The smart card body as claimed in claim 9, further comprising:
    a booster antenna.

15. A method for producing a smart card body, comprising:
    forming a light guiding structure having a first and a second coupling region for coupling electromagnetic radiation at least one of in or out;
    forming a smart card module receptacle region for receiving a smart card module by forming an opening in a first polymer layer;
    arranging the first polymer layer above the light guiding structure, wherein the smart card module receptacle region is arranged above the second coupling region in such a way that the smart card module receptacle region is optically coupled to the second coupling region; and
    connecting the first polymer layer and the light guiding structure to one another.

16. The method as claimed in claim 15,
    wherein forming the light guiding structure comprises shaping a polymer layer.

17. The method as claimed in claim 16,
    wherein shaping the polymer layer comprises at least one of embossing or hot embossing.

18. The method as claimed in claim 15,
    wherein forming the light guiding structure comprises coating the polymer layer.

19. The method as claimed in claim 15,
wherein connecting the first polymer layer and the light guiding structure comprises laminating.

20. A smart card, comprising
a smart card body having a smart card module receptacle region for receiving a smart card module and having an optical region alongside the smart card module receptacle region;
a light guiding structure, which is optically coupled to the receptacle region, for taking up electromagnetic radiation which is emitted or absorbed by an optoelectronic component of the smart card module, wherein the light guiding structure is designed to guide the electromagnetic radiation within the smart card body to or from a coupling region, which is optically coupled to the optical region; and
a smart card module arranged in the smart card module receptacle region.

21. A smart card, comprising:
a smart card body having a smart card module receptacle region and an optical display unit;
a smart card module arranged in the smart card module receptacle region, wherein the smart card module comprises:
　a carrier having a first main surface and a second main surface opposite the first main surface, wherein the carrier has at least one plated-through hole;
　a contact array arranged above the first main surface of the carrier and having a plurality of electrical contacts, wherein at least one electrical contact of the plurality of electrical contacts is electrically connected to the plated-through hole;
　a chip arranged above the second main surface, wherein the chip is electrically coupled to at least one electrical contact of the plurality of electrical contacts by the plated-through hole;
　a first antenna electrically conductively coupled to the chip;
a booster antenna having an inductive coupling region for inductive coupling to the first antenna of the smart card module;
wherein the optical display unit comprises at least one light emitting component electrically conductively connected to the chip and optically coupled to an optical region for emitting electromagnetic radiation, such that light emitted by the light emitting component is output by the optical region.

22. The smart card as claimed in claim 21,
wherein the optical display unit is arranged alongside the smart card module receptacle region.

23. The smart card as claimed in claim 21,
wherein the optical display unit comprises a second chip and a second antenna electrically conductively coupled to the second chip; and
wherein the booster antenna comprises a second inductive coupling region for inductive coupling to the second antenna.

24. A smart card, comprising:
a smart card body, comprising:
　a smart card module receptacle region for receiving a smart card module;
　an optical region for emitting or absorbing electromagnetic radiation; and
　a light guiding structure, which is optically coupled to the smart card module receptacle region, for taking up electromagnetic radiation which is emitted or absorbed by an optoelectronic component of the smart card module,
　wherein the light guiding structure is designed to guide the electromagnetic radiation within the smart card body to or from a first coupling region, which is optically coupled to the optical region; and
a smart card module, which is arranged in the smart card module receptacle region, the smart card module comprising:
　a carrier having a first main surface and a second main surface opposite the first main surface, wherein the carrier has at least one plated-through hole;
　a contact array arranged above the first main surface of the carrier and having a plurality of electrical contacts, wherein at least one electrical contact of the plurality of electrical contacts is electrically connected to the plated-through hole;
　a chip arranged above the second main surface, wherein the chip is electrically coupled to at least one electrical contact of the plurality of electrical contacts by the plated-through hole; and
　at least one optoelectronic component arranged above the second main surface and electrically conductively connected to the chip.

* * * * *